(12) United States Patent
Yu et al.

(10) Patent No.: US 11,909,134 B2
(45) Date of Patent: *Feb. 20, 2024

(54) EDGE CONNECTOR, CIRCUIT BOARD, AND CONNECTOR COMPONENT

(71) Applicant: HUAWEI TECHNOLOGIES CO., LTD., Shenzhen (CN)

(72) Inventors: Fei Yu, Wuhan (CN); Shiping Cheng, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/190,058

(22) Filed: Mar. 24, 2023

(65) Prior Publication Data

US 2023/0299515 A1  Sep. 21, 2023

Related U.S. Application Data

(63) Continuation of application No. 17/244,534, filed on Apr. 29, 2021, now Pat. No. 11,626,673, which is a
(Continued)

(30) Foreign Application Priority Data

Jun. 1, 2016  (CN) .......................... 201610383948.9

(51) Int. Cl.
*H01R 12/52* (2011.01)
*H05K 1/11* (2006.01)
(Continued)

(52) U.S. Cl.
CPC ............. *H01R 12/52* (2013.01); *H01R 12/55* (2013.01); *H01R 12/72* (2013.01); *H01R 13/11* (2013.01);
(Continued)

(58) Field of Classification Search
CPC ........ H01R 12/52; H01R 12/55; H01R 12/72; H01R 12/721; H01R 13/11; H01R 13/187;
(Continued)

(56) References Cited

U.S. PATENT DOCUMENTS 3,993,935 A  11/1976 Phillips et al.
5,144,586 A   9/1992 Faraci
(Continued)

FOREIGN PATENT DOCUMENTS

CN  101521984 A  9/2009
CN  101643927 A  2/2010
(Continued)

OTHER PUBLICATIONS

QSFP-DD MSA, QDFP-DD Specification for QSFP Double Density 8X Pluggable Transceiver Rev 0.2 Mar. 29, 2016, total 54 pages.

*Primary Examiner* — Tho D Ta
(74) *Attorney, Agent, or Firm* — HUAWEI TECHNOLOGIES CO., LTD.

(57) ABSTRACT

An edge connector includes a first row of golden fingers and a second row of golden fingers. The first row of golden fingers is adjacent to a plugging end of the edge connector, and the second row of golden fingers is adjacent to the first row of golden fingers. In a plugging direction of the edge connector, each golden finger in the first row of golden fingers has a first end proximate to the plugging end and a second end opposite to the first end. A first end of a grounded golden finger in the first row of golden fingers is protruded from other golden fingers, and second ends of two or more than two golden fingers in the first row of golden fingers are not aligned with each other.

14 Claims, 5 Drawing Sheets

Related U.S. Application Data continuation of application No. 16/108,945, filed on Aug. 22, 2018, now Pat. No. 10,998,653, which is a continuation of application No. PCT/CN2017/086167, filed on May 26, 2017.

(51) Int. Cl.

| | | |
|---|---|---|
| *H01R 12/55* | (2011.01) | |
| *H01R 13/11* | (2006.01) | |
| *H01R 13/187* | (2006.01) | |
| *H01R 12/72* | (2011.01) | |
| *H05K 1/02* | (2006.01) | |

(52) U.S. Cl.
CPC .......... *H01R 13/187* (2013.01); *H05K 1/117* (2013.01); *H01R 12/721* (2013.01); *H05K 1/0219* (2013.01); *H05K 1/0245* (2013.01); *H05K 2201/0746* (2013.01); *H05K 2201/094* (2013.01); *H05K 2201/09145* (2013.01); *H05K 2201/09236* (2013.01); *H05K 2201/09336* (2013.01); *H05K 2201/09409* (2013.01); *H05K 2201/09427* (2013.01); *H05K 2201/09709* (2013.01); *H05K 2201/10325* (2013.01); *H05K 2201/10356* (2013.01)

(58) Field of Classification Search
CPC ......... H05K 1/117; H05K 2201/09145; H05K 2201/2201; H05K 2201/09409; H05K 2201/09709; H05K 2201/094; Y10S 439/924; Y10S 439/951

See application file for complete search history.

(56) References Cited

U.S. PATENT DOCUMENTS

| | | |
|---|---|---|
| 5,210,855 A | 5/1993 | Bartol |
| 7,628,655 B1 | 12/2009 | Chen |
| 7,798,820 B2 | 9/2010 | Hong |
| 8,353,728 B2 | 1/2013 | Wang et al. |
| 10,998,653 B2 * | 5/2021 | Yu .......................... H05K 1/117 |
| 2005/0054241 A1 * | 3/2005 | Peng .................... H01R 31/005 |
| | | 439/638 |
| 2007/0232091 A1 | 10/2007 | Hong |
| 2008/0173995 A1 | 7/2008 | Kuratomi et al. |
| 2011/0003487 A1 | 1/2011 | Xiang et al. |
| 2013/0017735 A1 | 1/2013 | Luo et al. |
| 2014/0349496 A1 | 11/2014 | Zhu et al. |

FOREIGN PATENT DOCUMENTS

| | | |
|---|---|---|
| CN | 201830545 U | 5/2011 |
| CN | 102271465 A | 12/2011 |
| CN | 102377043 A | 3/2012 |
| CN | 102881319 A | 1/2013 |
| CN | 202799376 U | 3/2013 |
| CN | 103474089 A | 12/2013 |
| CN | 105093728 A | 11/2015 |
| CN | 105516412 A | 4/2016 |
| CN | 105932447 A | 9/2016 |
| JP | 2003217360 A | 7/2003 |
| JP | 2008130508 A | 6/2008 |
| JP | 2011119123 A | 6/2011 |

\* cited by examiner

EDGE CONNECTOR, CIRCUIT BOARD, AND CONNECTOR COMPONENT

CROSS-REFERENCE TO RELATED APPLICATIONS

This application is a continuation of U.S. patent application Ser. No. 17/244,534, filed on Apr. 29, 2021, now U.S. Pat. No. 11,626,673, which is a continuation of U.S. patent application Ser. No. 16/108,945, filed on Aug. 22, 2018, now U.S. Pat. No. 10,998,653. which is a continuation of International Application No. PCT/CN2017/086167, filed on May 26, 2017. The International Application claims priority to Chinese Patent Application No. 201610383948.9, filed on Jun. 1, 2016. All of the afore-mentioned patent applications are hereby incorporated by reference in their entireties.

TECHNICAL FIELD

The present disclosure relates to the field of communications technologies, and in particular, to an edge connector, a circuit board, and a connector component.

BACKGROUND

As communications modules have an increasingly smaller size and an increasingly larger capacity, it is a simple and feasible method to increase a communication rate by increasing a quantity of channels. An edge connector is a frequently used connector. Such a connector has the feature, a golden finger is in contact with a contact spring plate in a peer female connector to transmit a signal between the edge connector and the female connector. Edge connectors currently used in the industry mostly include a single row of golden fingers. The single row of golden fingers includes a relatively small quantity of channels, and consequently an edge connector using a single row of golden fingers has a relatively low communication rate. To resolve this technical problem, skilled persons have carried out studies on use of an edge connector including double rows of golden fingers. However, the studies show that the edge connector including double rows of golden fingers has problems such as surge overshoot and current backflow, eventually leading to a shortened life span of the edge connector.

SUMMARY

An objective of the present disclosure is to provide an edge connector in order to prolong a life span of the edge connector to some extent.

According to a first aspect, this application provides an edge connector, including a base and a first row of golden fingers and a second row of golden fingers, where the first row of golden fingers and the second row of golden fingers are disposed in parallel on a surface of the base, the first row of golden fingers is adjacent to a plugging end of the edge connector, and the second row of golden fingers is adjacent to the first row of golden fingers, the first row of golden fingers includes a plurality of golden fingers that are disposed in parallel and isolated from each other, and the second row of golden fingers includes a plurality of golden fingers that are disposed in parallel and isolated from each other, where the golden finger is electrically connected to a circuit inside the base, in a plugging direction of the edge connector, each golden finger in the first row of golden fingers has a first end that is close to the plugging end and a second end that is opposite to the first end, a first end of a grounded golden finger in the plurality of golden fingers in the first row of golden fingers is protruded from other golden fingers, and second ends of two or more than two golden fingers in the first row of golden fingers are not aligned with each other, and a first end that is of a grounded golden finger in the second row of golden fingers and that is close to the plugging end in the plugging direction of the edge connector is protruded from other golden fingers.

That "a first end of a grounded golden finger in the first row of golden fingers is protruded from other golden fingers" is to ensure that first ends of the plurality of golden fingers in the first row of golden fingers are not aligned with each other. That "a first end that is of a grounded golden finger in the second row of golden fingers and that is close to the plugging end in the plugging direction of the edge connector is protruded from other golden fingers" is to ensure that first ends of the plurality of golden fingers in the second row of golden fingers are not aligned with each other. In this application, the first ends of the plurality of golden fingers in the first row of golden fingers are set to be not aligned with each other, second ends of the plurality of golden fingers in the first row of golden fingers are set to be not aligned with each other, and the first ends of the plurality of golden fingers in the second row of golden fingers are set to be not aligned with each other to avoid a possible problem, in a process in which the edge connector is plugged into/out of a female connector through hot plug, of simultaneous power-on or power-off of any row of the first row of golden fingers or the second row of golden fingers, and further avoid problems such as surge overshoot and current backflow caused when golden fingers in a same row are simultaneously powered on or powered off such that a life span of the edge connector can be prolonged to some extent.

With reference to the first aspect, in a first possible implementation, a second end of the grounded golden finger in the first row of golden fingers is protruded from the other golden fingers.

It should be noted that the other golden fingers are golden fingers other than the grounded golden finger in the first row of golden fingers. The grounded golden finger is the longest compared with the other golden fingers in the first row of golden fingers. Therefore, the foregoing limitation helps reduce a surface area, occupied by the first row of golden fingers, of the base of the edge connector, thereby facilitating miniaturization of the edge connector.

With reference to the first aspect or the first possible implementation of the first aspect, in a second possible implementation. in addition to the grounded golden finger, the first row of golden fingers further includes a golden finger for transmitting a power signal, a distance that is in the plugging direction of the edge connector and that is between a reference line and the second end of the grounded golden finger in the first row of golden fingers is greater than a distance that is in the plugging direction of the edge connector and that is between the reference line and a second end of the golden finger for transmitting a power signal in the first row of golden fingers, the distance that is in the plugging direction of the edge connector and that is between the reference line and the second end of the golden finger for transmitting a power signal in the first row of golden fingers is greater than or equal to a distance that is in the plugging direction of the edge connector and that is between the reference line and a second end of a golden finger for transmitting a communication signal in the first row of golden fingers, and the reference line is perpendicular to the plugging direction of the edge connector, and divides each golden finger in the first row of golden fingers into two parts.

A length of the grounded golden finger in the plugging direction of the edge connector is greater than a length, in the plugging direction of the edge connector, of the golden finger for transmitting a power signal. The length, in the plugging direction of the edge connector, of the golden finger for transmitting a power signal is greater than a length, in the plugging direction of the edge connector, of the golden finger for transmitting a communication signal. Therefore, in this application, it is ensured that the distance between the reference line and the second end of the grounded golden finger in the first row of golden fingers is greater than the distance between the reference line and the second end of the golden finger for transmitting a power signal in the first row of golden fingers, and that the distance between the reference line and the second end of the golden finger for transmitting a power signal in the first row of golden fingers is greater than the distance between the reference line and the second end of the golden finger for transmitting a communication signal in the first row of golden fingers to reduce a surface area, occupied by the first row of golden fingers, of the base of the edge connector, thereby facilitating miniaturization of the edge connector.

With reference to the second possible implementation of the first aspect, in a third possible implementation, a distance that is in the plugging direction of the edge connector and that is between the reference line and the first end of the grounded golden finger in the first row of golden fingers is greater than a distance that is in the plugging direction of the edge connector and that is between the reference line and a first end of the golden finger for transmitting a power signal in the first row of golden fingers, and the distance that is in the plugging direction of the edge connector and that is between the reference line and the first end of the golden finger for transmitting a power signal in the first row of golden fingers is greater than a distance that is in the plugging direction of the edge connector and that is between the reference line and a first end of the golden finger for transmitting a communication signal in the first row of golden fingers.

In the foregoing technical solution, in a process of powering on the plurality of golden fingers in the first row of golden fingers, the grounded golden finger can be powered on before the golden finger for transmitting a power signal, and the golden finger for transmitting a power signal can be powered on before the golden finger for transmitting a communication signal, and in a power-off process, the golden finger for transmitting a communication signal can be powered off before the golden finger for transmitting a power signal, and the golden finger for transmitting a power signal can be powered off before the grounded golden finger. In the foregoing technical solution, the grounded golden finger is the first to be powered on and the last to be powered off to ensure security of the first row of golden fingers, and avoid life span shortening of the edge connector caused by a problem such as surge overshoot. The golden finger for transmitting a power signal is powered on before the golden finger for transmitting a communication signal, and is powered off after the golden finger for transmitting a communication signal, to ensure that the golden finger for transmitting a communication signal can integrally transmit a signal, and avoid a problem that a signal transmitted on the golden finger for transmitting a communication signal is lost because the golden finger fails to be powered on in time.

With reference to the second or the third possible implementation of the first aspect, in a fourth possible implementation, the reference line divides a shortest golden finger in the first row of golden fingers into two parts of a same length in the plugging direction of the edge connector. Therefore, the surface area, occupied by the first row of golden fingers, of the base of the edge connector can be further reduced, thereby facilitating miniaturization of the edge connector.

With reference to any one of the first aspect or the first to the fourth possible implementations of the first aspect, in a fifth possible implementation, the second row of golden fingers further includes a golden finger for transmitting a power signal, a distance that is in the plugging direction of the edge connector and that is between a reference line and the first end of the grounded golden finger in the second row of golden fingers is greater than a distance that is in the plugging direction of the edge connector and that is between the reference line and a first end of the golden finger for transmitting a power signal in the second row of golden fingers, the distance that is in the plugging direction of the edge connector and that is between the reference line and the first end of the golden finger for transmitting a power signal in the second row of golden fingers is greater than a distance that is in the plugging direction of the edge connector and that is between the reference line and a first end of a golden finger for transmitting a communication signal in the second row of golden fingers, and the reference line is perpendicular to the plugging direction of the edge connector, and divides each golden finger in the second row of golden fingers into two parts.

In the foregoing technical solution, in a process of powering on the plurality of golden fingers in the second row of golden fingers, the grounded golden finger can be powered on before the golden finger for transmitting a power signal, and the golden finger for transmitting a power signal can be powered on before the golden finger for transmitting a communication signal, and in a power-off process, the golden finger for transmitting a communication signal can be powered off before the golden finger for transmitting a power signal, and the golden finger for transmitting a power signal can be powered off before the grounded golden finger. In the foregoing technical solution, the grounded golden finger is the first to be powered on and the last to be powered off, to ensure security of the second row of golden fingers, and avoid life span shortening of the edge connector caused by a problem such as surge overshoot. The golden finger for transmitting a power signal is powered on before the golden finger for transmitting a communication signal, and is powered off after the golden finger for transmitting a communication signal to ensure that the golden finger for transmitting a communication signal can integrally transmit a signal, and avoid a problem that a signal transmitted on the golden finger for transmitting a communication signal is lost because the golden finger fails to be powered on in time.

With reference to any one of the first aspect or the first to the fifth possible implementations of the first aspect, in a sixth possible implementation, a quantity of golden fingers included in the second row of golden fingers is the same as a quantity of golden fingers included in the first row of golden fingers, and in the plugging direction of the edge connector, each golden finger in the first row of golden fingers is in a same column as a golden finger in the second row of golden fingers, and two golden fingers in a same column are configured to transmit signals of a same type.

In a process in which the edge connector is plugged into the female connector, a contact spring plate in contact with a golden finger in the second row of golden fingers is first in contact with another golden finger in a same column as the golden finger, and then slides over the other golden finger while keeping in touch with the other golden finger. It is ensured that two golden fingers in a same column can transmit signals of a same type to avoid that signals transmitted on the golden fingers in the edge connector are disordered in the process in which the edge connector is plugged into the female connector.

With reference to the sixth possible implementation of the first aspect, in a seventh possible implementation, two golden fingers in a same column that are both for grounding are connected.

Therefore, a technology difficulty in manufacturing the edge connector can be reduced while ensuring that the edge connector works normally.

With reference to the sixth or the seventh possible implementation of the first aspect, in an eighth possible implementation, in the plurality of golden fingers in the first row of golden fingers and the plurality of golden fingers in the second row of golden fingers, central lines, separately in the plugging direction of the edge connector, of two end parts that are of two golden fingers in a same column and that are adjacent to each other substantially overlap. Therefore, golden fingers in a same column each can be in good contact with a corresponding contact spring plate to produce a relatively good signal transmission effect.

With reference to any one of the first aspect or the first to the eighth possible implementations of the first aspect, in a ninth possible implementation, second ends of all the golden fingers in the second row of golden fingers are aligned with each other, and the second end of each golden finger in the second row of golden fingers is the other end opposite to an end that is of the golden finger in the second row of golden fingers and that is close to the plugging end. In this technical solution, because the second ends of all the golden fingers in the second row of golden fingers are aligned with each other, the base of the edge connector is divided into relatively regular areas by the second row of golden fingers, thereby facilitating arrangement of another component on the base.

With reference to any one of the first aspect or the first to the ninth possible implementations of the first aspect, in a tenth possible implementation, a minimum spacing between the first row of golden fingers and the second row of golden fingers meets a requirement of an electrical short circuit, and a maximum spacing is less than or equal to a length of a shortest golden finger in the edge connector to help reduce a surface area, occupied by the first row of golden fingers and the second row of golden fingers, of the base of the edge connector, thereby further facilitating miniaturization of the edge connector.

According to a second aspect, this application provides a circuit board, including a circuit and the edge connector according to any one of the first aspect or the first to the tenth possible implementations of the first aspect, the edge connector is at an edge of the circuit board, and each golden finger in the edge connector is connected to the circuit. Compared with an edge connector in the other approaches, the edge connector used in the circuit board can avoid problems such as surge overshoot and current backflow caused when golden fingers in a same row are simultaneously powered on or simultaneously powered off. Therefore, the circuit board in this application can have relatively good security performance due to relatively good security performance of the used edge connector.

With reference to the second aspect, in a first possible implementation, the circuit board further includes a cable layer, the cable layer is at an inner layer of the circuit board, and the circuit is disposed at the cable layer. Because the cable layer is at the inner layer of the circuit board, and the circuit is disposed at the cable layer, the circuit transmits a signal at a relatively fast rate, thereby helping increase a rate of transmitting a signal between the edge connector and the circuit in the circuit board.

According to a third aspect, this application provides a connector component, including a female connector and the edge connector according to any one of the first aspect or the first to the tenth possible implementations of the first aspect, where the edge connector is plugged into the female connector to connect to the female connector, the female connector includes a first row of contact spring plates and a second row of contact spring plates, the first row of contact spring plates includes a plurality of first contact spring plates, and the second row of contact spring plates includes a plurality of second contact spring plates, each first contact spring plate in the first row of contact spring plates is configured to be in contact with a golden finger in a first row of golden fingers, and each second contact spring plate in the second row of contact spring plates is configured to be in contact with a golden finger in a second row of golden fingers.

Compared with an edge connector in the other approaches, the edge connector used in the connector component can avoid problems such as surge overshoot and current backflow caused when golden fingers in a same row are simultaneously powered on or simultaneously powered off. Therefore, the connector component in this application can have relatively good security performance due to relatively good security performance of the used edge connector.

With reference to the third aspect, in a first possible implementation, a spacing between the first row of contact spring plates and the second row of contact spring plates is $L_1$, a maximum distance between a second end of each golden finger in the first row of golden fingers and a first end of a golden finger that is in the second row of golden fingers and that is in a same column as the golden finger in the first row of golden fingers is $S_1$, and a maximum distance between a first end of each golden finger in the first row of golden fingers and a second end of a golden finger that is in the second row of golden fingers and that is in a same column as the golden finger in the first row of golden fingers is $S_2$, where $L_1$, $S_1$, and $S_1$ each are an integer greater than 0, and $L_1$ is greater than or equal to $S_1$ and less than or equal to $S_2$.

A second end of each golden finger in the second row of golden fingers is the other end opposite to an end that is of the golden finger in the second row of golden fingers and that is close to the plugging end. This implementation is used to ensure that each contact spring plate in the first row of contact spring plates and each contact spring plate in the second row of contact spring plates each can be in contact with a corresponding golden finger.

With reference to the third aspect or the first possible implementation of the third aspect, in a second possible implementation, positions at which the plurality of first contact spring plates are in contact with the golden fingers are in a straight line perpendicular to a plugging direction of the edge connector. Therefore, a machining technology can be simplified and production efficiency can be improved.

With reference to any one of the third aspect, in a third possible implementation, positions at which the plurality of second contact spring plates are in contact with the golden fingers are in a straight line perpendicular to a plugging direction of the edge connector. Therefore, the machining technology can be simplified and the production efficiency can be improved.

With reference to any one of the third aspect or the first to the third possible implementations of the third aspect, in a fourth possible implementation, each first contact spring plate is in a same column as a second contact spring plate, and the first contact spring plate and the second contact spring plate in the same column transmit signals of a same type. In a process in which the edge connector is plugged into the female connector, before each second contact spring plate is in contact with a golden finger in the second row of golden fingers, the second contact spring plate is first in contact with a golden finger in the first row of golden fingers, and the second contact spring plate slides over the golden finger in the first row of golden fingers while keeping in contact with the golden finger, and is then in contact with the golden finger in the second row of golden fingers. Therefore, if the second contact spring plate and the first contact spring plate in the same column transmit signals of different types, in the process in which the edge connector is plugged into the female connector, signal transmission on the golden finger in the first row of golden fingers is disordered because a type of an actually received signal is different from a type of a signal that ought to be received.

According to a fourth aspect, this application further provides a communications device, including the circuit board and the female connector according to the second aspect or the first possible implementation of the second aspect, and the edge connector on the circuit board is plugged into the female connector to connect to the female connector.

Compared with a circuit board in the other approaches, the circuit board used in the communications device has better security performance, and therefore the communications device in this application can also have relatively good security performance.

DESCRIPTION OF EMBODIMENTS

The following clearly describes the technical solutions in this application with reference to the accompanying drawings in this application. Described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Figure 1:
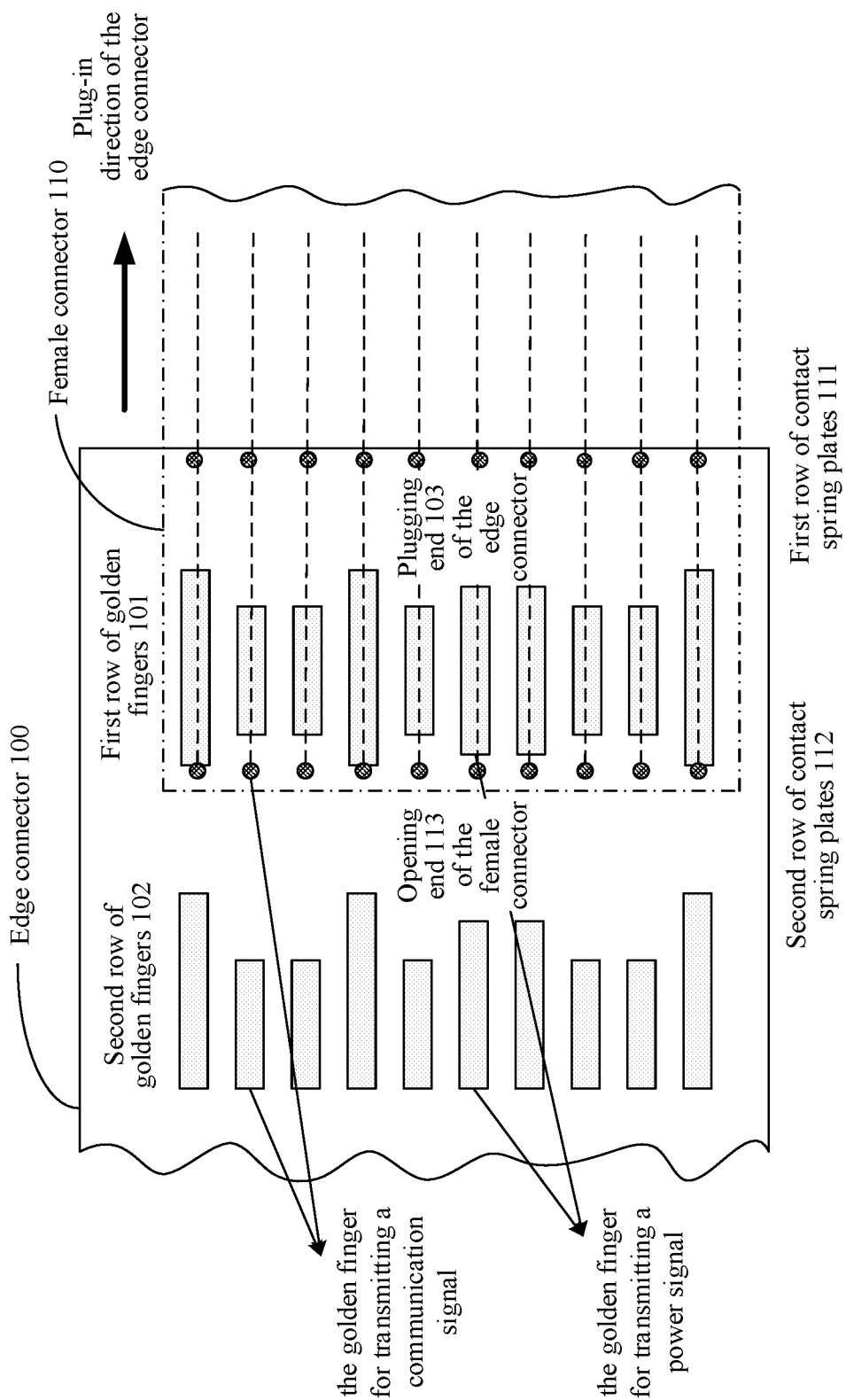
FIG. 1 is a schematic structural diagram of a connector component according to this application.

Referring to FIG. 1, FIG. 1 is a schematic structural diagram of a connector component. The connector component may be applied to a specific scenario such as a communication cabinet. The connector component includes an edge connector 100 and a female connector 110. The edge connector 100 includes a first row of golden fingers 101 and a second row of golden fingers 102. The first row of golden fingers 101 is adjacent to a plugging end 103 of the edge connector, and the second row of golden fingers 102 is adjacent to the first row of golden fingers 101. The female connector 110 includes a first row of contact spring plates 111 and a second row of contact spring plates 112. The second row of contact spring plates 112 is adjacent to an opening end 113 of the female connector, and the first row of contact spring plates 111 is adjacent to the second row of contact spring plates 112. Further, each golden finger in the first row of golden fingers 101 is in contact with a contact spring plate in the first row of contact spring plates 111, and each golden finger in the second row of golden fingers 102 is in contact with a contact spring plate in the second row of contact spring plates 112. Compared with an edge connector in other approaches, the edge connector 100 used in the connector component can avoid problems such as surge overshoot and current backflow caused when golden fingers in a same row are simultaneously powered on or simultaneously powered off. Therefore, the connector component in this application can have relatively good security performance due to relatively good security performance of the used edge connector 100. As for a reason why the edge connector 100 used in the connector component can avoid problems such as surge overshoot and current backflow caused when golden fingers in a same row are simultaneously powered on or simultaneously powered off, detailed descriptions are provided subsequently.

It should be noted that in the connector component provided in this application, the edge connector 100 is plugged into/out of the female connector 110 through hot plug.

Figure 3:
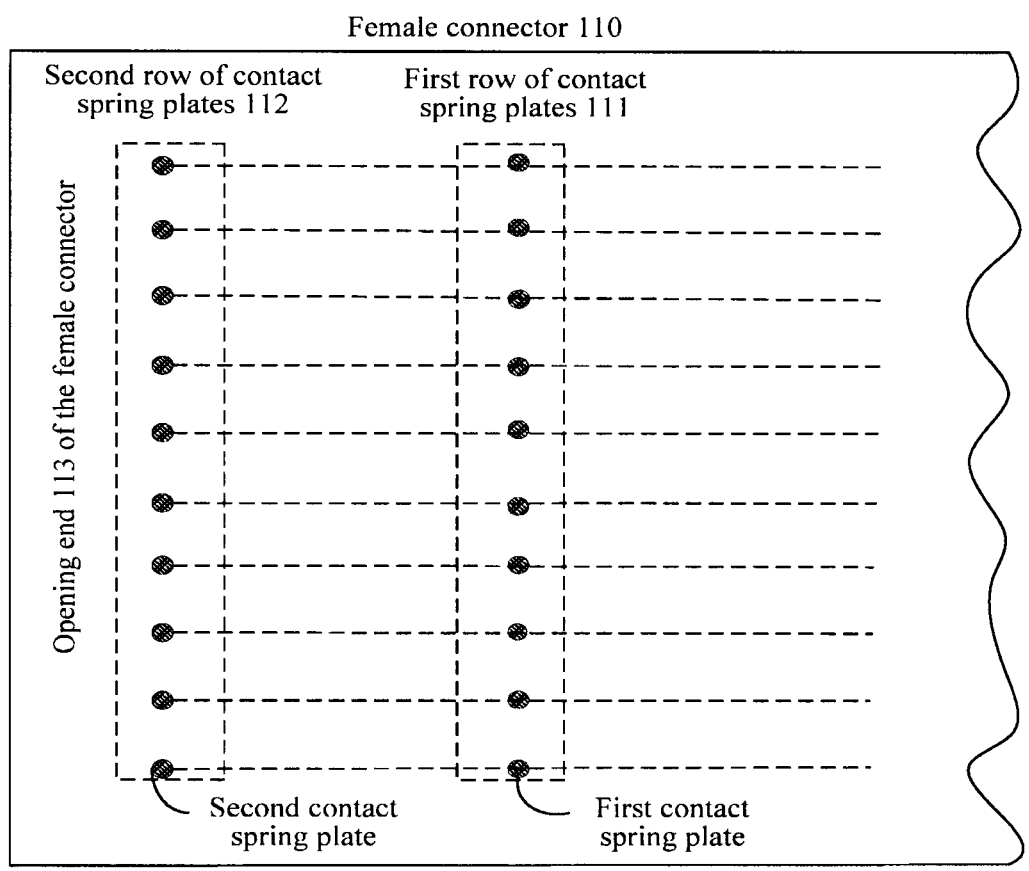
FIG. 3 is a schematic structural diagram of a female connector in the connector component shown in FIG. 1.

Referring to FIG. 1 and FIG. 3, it is easy to learn that the first row of contact spring plates 111 includes a plurality of first contact spring plates, and the second row of contact spring plates 112 includes a plurality of second contact spring plates. It should be noted that positions at which the plurality of first contact spring plates are in contact with the golden fingers may be in a straight line perpendicular to a plug-in direction of the edge connector 100.

In another implementation of this application, positions at which the plurality of second contact spring plates are in contact with the golden fingers may also be in the straight line perpendicular to the plug-in direction of the edge connector 100.

It should be noted that neither a straight line formed by the plurality of first contact spring plates nor a straight line formed by the plurality of second contact spring plates is necessarily a strict straight line, or in other words, may be a broken line. The straight line may be bent due to an unavoidable error. The unavoidable error may be an error in technology manufacturing or an error in designing. A bending degree of the broken line needs to be acceptable to a person skilled in the art.

Figure 2:
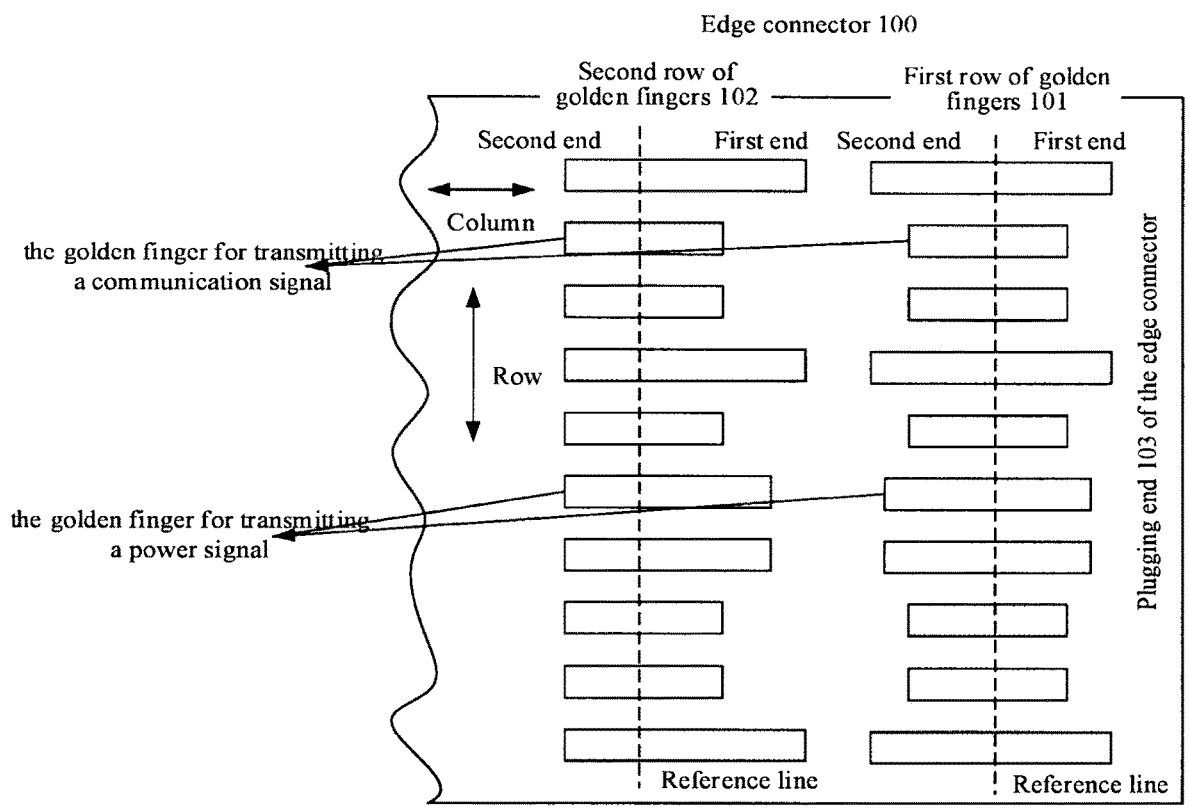
FIG. 2 is a schematic structural diagram of an edge connector according to this application.

Referring to FIG. 2, FIG. 2 is a schematic structural diagram of an edge connector 100 according to this application. It should be noted that the edge connector 100 may be disposed at an edge of a circuit board and be integrated with the circuit board, or may be disposed at an end of a memory card and be integrated with the memory card, or may be disposed at an end of a cable and be integrated with the cable. The edge connector 100 may be used in the connector component shown in FIG. 1, and is configured to be plugged into the female connector 110, to implement signal transmission with the female connector 110.

As shown in FIG. 2, the edge connector 100 includes a first row of golden fingers 101 and a second row of golden fingers 102. The first row of golden fingers 101 is adjacent to a plugging end 103 of the edge connector, and the second row of golden fingers 102 is adjacent to the first row of golden fingers 101. The first row of golden fingers 101 includes a plurality of golden fingers, and the second row of golden fingers 102 includes a plurality of golden fingers. In a plugging direction of the edge connector 100, each golden finger in the first row of golden fingers 101 has a first end close to the plugging end 103 and a second end opposite to the first end. A first end of a grounded golden finger in the plurality of golden fingers in the first row of golden fingers 101 is protruded from other golden fingers, and second ends of two or more than two golden fingers in the first row of golden fingers 101 are not aligned with each other. A first end that is of a grounded golden finger in the second row of golden fingers 102 and that is close to the plugging end 103 in the plugging direction of the edge connector 100 is protruded from other golden fingers.

It should be noted that in this application, golden fingers are classified into a grounded golden finger, a golden finger for transmitting a power signal, a golden finger for transmitting a communication signal, a golden finger for transmitting another signal, and the like according to functions of signals transmitted by the golden fingers. The golden finger for transmitting a power signal means that a function of a signal transmitted by the golden finger is to power on the edge connector to work, and the golden finger for transmitting a communication signal means that a function of a signal transmitted by the golden finger is to enable the golden finger to transmit a communication signal. Therefore, although the golden finger for transmitting a communication signal substantially transmits an electrical signal, a function of the electrical signal transmitted by the golden finger for transmitting a communication signal is different from a function of an electrical signal transmitted by the golden finger for transmitting a power signal. Therefore, in this application, according to functions of electrical signals transmitted by golden fingers, the golden fingers are classified into a golden finger for transmitting a power signal and a golden finger for transmitting a communication signal. It should be further noted that a type of a signal transmitted by the golden finger for transmitting a communication signal may be a control signal, a high-speed signal, a clock signal, or the like.

In an implementation of this application, the edge connector 100 may further include a base. The first row of golden fingers 101 and the second row of golden fingers 102 may be disposed in parallel on a surface of the base. Each golden finger in the first row of golden fingers 101 and each golden finger in the second row of golden fingers 102 may be electrically connected to a circuit inside the base.

It should be noted that if the base includes a first surface and a second surface that is opposite to the first surface, the first row of golden fingers 101 and the second row of golden fingers 102 may be disposed in parallel on the first surface of the base, and when the second surface includes a golden finger for transmitting a power signal, the first row of golden fingers 101 and the second row of golden fingers 102 each may include at least a grounded golden finger and a golden finger for transmitting a communication signal. Certainly, the first row of golden fingers may further include a golden finger connected to a power supply. Similarly, the second row of golden fingers may further include a golden finger connected to a power supply.

It should be noted that because a part that forms the circuit may alternatively be a cable in addition to an element such as a capacitor, a resistor, or an inductor, during specific implementation, that each golden finger in the first row of golden fingers 101 and each golden finger in the second row of golden fingers 102 may be electrically connected to the circuit inside the base means that the golden finger may be directly electrically connected to the cable or the element.

It should be noted that, as shown in FIG. 2, FIG. 2 shows respective extension directions of a row and a column described in this application. In this application, the row and the column are a pair of relative concepts. The extension directions of the row and the column are perpendicular to each other. It should be noted that, during technology design and manufacturing, due to an error or a technology limitation, the row and the column in this application may not be strictly perpendicular to each other, but instead, an included angle between the row and the column is approximately 90° rather than 90°. However, the included angle between the row and the column needs to be acceptable to a person skilled in the art, and the included angle should not affect achievement of this application.

In another implementation of this application, the plurality of golden fingers included in the first row of golden fingers 101 may be disposed in parallel at intervals.

In still another implementation of this application, the plurality of golden fingers included in the second row of golden fingers 102 may also be disposed in parallel at intervals.

It should be noted that the first row of golden fingers 101 and the second row of golden fingers 102 each may include an undefined golden finger. The undefined golden finger means that one end of the golden finger is in contact with a contact spring plate but the other end is not connected to the circuit. Consequently, after receiving a signal transmitted from the contact spring plate, the golden finger fails to transmit the signal to another component through the circuit.

It may be learned from the foregoing descriptions that, that "a first end of a grounded golden finger in the first row of golden fingers 101 is protruded from other golden fingers" is to ensure that first ends of the plurality of golden fingers in the first row of golden fingers 101 are not aligned with each other, and that "a first end that is of a grounded golden finger in the second row of golden fingers 102 and that is close to the plugging end 103 in the plugging direction of the edge connector 100 is protruded from other golden fingers" is to ensure that first ends of the plurality of golden fingers in the second row of golden fingers 102 are not aligned with each other. In this application, the first ends of the plurality of golden fingers in the first row of golden fingers 101 are set to be not aligned with each other, second ends of the plurality of golden fingers in the first row of golden fingers 101 are set to be not aligned with each other, and the first ends of the plurality of golden fingers in the second row of golden fingers 102 are set to be not aligned with each other to avoid a possible problem, in a process in which the edge connector 100 is plugged into/out of the female connector 110 through hot plug, of simultaneous power-on or power-off of any row of the first row of golden fingers 101 and the second row of golden fingers 102, and further avoid problems such as surge overshoot and current backflow caused when golden fingers in a same row are simultaneously powered on or powered off such that a life span of the edge connector 100 can be prolonged to some extent.

In an implementation of this application, a second end of the grounded golden finger in the first row of golden fingers 101 is protruded from the other golden fingers.

A person skilled in the art should know that one row of golden fingers includes at least a grounded golden finger and a golden finger for transmitting a communication signal. However, a grounded golden finger is the longest among all the golden fingers included in the edge connector. If the row of golden fingers further includes a golden finger for transmitting a power signal, a length of the grounded golden finger is greater than a length of the golden finger for transmitting a power signal, and the length of the golden finger for transmitting a power signal is greater than a length of the golden finger for transmitting a communication signal.

A person skilled in the art should further know that even though both two golden fingers are grounded or are for transmitting a power signal or are for transmitting a communication signal, lengths of the golden fingers are not necessarily completely equal, or in other words, lengths of the golden fingers are substantially equal. The "substantially equal" should be determined based on a technical feature that is understood by a person skilled in the art and that can achieve the inventive objective of the present disclosure.

It may be learned from the foregoing descriptions that the other golden fingers are golden fingers other than the grounded golden finger in the first row of golden fingers 101, and may include only a golden finger for transmitting a communication signal, or may include both a golden finger for transmitting a communication signal and a golden finger for transmitting a power signal. The grounded golden finger is the longest compared with the other golden fingers in the first row of golden fingers 101. Therefore, the foregoing limitation helps reduce a surface area, occupied by the first row of golden fingers 101, of the base of the edge connector 100, thereby facilitating miniaturization of the edge connector 100.

In another implementation of this application, as shown in FIG. 2, in addition to the grounded golden finger, the first row of golden fingers 101 further includes a golden finger for transmitting a power signal. A distance that is in the plugging direction of the edge connector 100 and that is between a reference line and the second end of the grounded golden finger in the first row of golden fingers 101 is greater than a distance that is in the plugging direction of the edge connector 100 and that is between the reference line and a second end of the golden finger for transmitting a power signal in the first row of golden fingers 101. The distance that is in the plugging direction of the edge connector 100 and that is between the reference line and the second end of the golden finger for transmitting a power signal in the first row of golden fingers 101 is greater than or equal to a distance that is in the plugging direction of the edge connector 100 and that is between the reference line and a second end of a golden finger for transmitting a communication signal in the first row of golden fingers 101. The reference line is perpendicular to the plugging direction of the edge connector 100, and divides each golden finger in the first row of golden fingers 101 into two parts.

It should be noted that, that "the reference line divides each golden finger in the first row of golden fingers 101 into two parts" means that a length of a part, on each side of the reference line, of each golden finger in the first row of golden fingers 101 is greater than 0 in the plugging direction of the edge connector 100.

As described above, usually, a length of the grounded golden finger in the plugging direction of the edge connector 100 is greater than a length, in the plugging direction of the edge connector 100, of the golden finger for transmitting a power signal. The length, in the plugging direction of the edge connector 100, of the golden finger for transmitting a power signal is greater than a length, in the plugging direction of the edge connector 100, of the golden finger for transmitting a communication signal. Therefore, in this application, it is ensured that the distance between the reference line and the second end of the grounded golden finger in the first row of golden fingers 101 is greater than the distance between the reference line and the second end of the golden finger for transmitting a power signal in the first row of golden fingers 101, and that the distance between the reference line and the second end of the golden finger for transmitting a power signal in the first row of golden fingers 101 is greater than the distance between the reference line and the second end of the golden finger for transmitting a communication signal in the first row of golden fingers 101 to reduce a surface area, occupied by the first row of golden fingers 101, of the base of the edge connector 100, thereby facilitating miniaturization of the edge connector 100.

In still another implementation of this application, as shown in FIG. 2, a distance that is in the plugging direction of the edge connector 100 and that is between the reference line and the first end of the grounded golden finger in the first row of golden fingers 101 is greater than a distance that is in the plugging direction of the edge connector 100 and that is between the reference line and a first end of the golden finger for transmitting a power signal in the first row of golden fingers 101.

The distance that is in the plugging direction of the edge connector 100 and that is between the reference line and the first end of the golden finger for transmitting a power signal in the first row of golden fingers 101 is greater than a distance that is in the plugging direction of the edge connector 100 and that is between the reference line and a first end of the golden finger for transmitting a communication signal in the first row of golden fingers 101.

In the foregoing technical solution, in a process of powering on the plurality of golden fingers in the first row of golden fingers, the grounded golden finger can be powered on before the golden finger for transmitting a power signal, and the golden finger for transmitting a power signal can be powered on before the golden finger for transmitting a communication signal, and in a power-off process, the golden finger for transmitting a communication signal can be powered off before the golden finger for transmitting a power signal, and the golden finger for transmitting a power signal can be powered off before the grounded golden finger. In the foregoing technical solution, the grounded golden finger is the first to be powered on and the last to be powered off, to ensure security of the first row of golden fingers, and avoid life span shortening of the edge connector caused by a problem such as surge overshoot. The golden finger for transmitting a power signal is powered on before the golden finger for transmitting a communication signal, and is powered off after the golden finger for transmitting a communication signal, to ensure that the golden finger for transmitting a communication signal can integrally transmit a signal, and avoid a problem that a signal transmitted on the golden finger for transmitting a communication signal is lost because the golden finger fails to be powered on in time.

Further referring to FIG. 2, in still another implementation of this application, the reference line divides a shortest golden finger in the first row of golden fingers 101 into two parts of a same length in the plugging direction of the edge connector 100. It should be understood that, the "same" herein should be "substantially the same". Strictly, the two parts may have different lengths, but a length difference between the two parts should not be excessively large. A fluctuation range of the length difference between the two parts needs to be subject to understanding of a person skilled in the art. This is not limited herein. In this implementation, the surface area, occupied by the first row of golden fingers, of the base of the edge connector can be further reduced, thereby facilitating miniaturization of the edge connector.

In still another implementation of this application, as shown in FIG. 2, the second row of golden fingers 102 further includes a golden finger for transmitting a power signal. A distance that is in the plugging direction of the edge connector 100 and that is between a reference line and the first end of the grounded golden finger in the second row of golden fingers 102 is greater than a distance that is in the plugging direction of the edge connector 100 and that is between the reference line and a first end of the golden finger for transmitting a power signal in the second row of golden fingers 102. The distance that is in the plugging direction of the edge connector 100 and that is between the reference line and the first end of the golden finger for transmitting a power signal in the second row of golden fingers 102 is greater than a distance that is in the plugging direction of the edge connector 100 and that is between the reference line and a first end of a golden finger for transmitting a communication signal in the second row of golden fingers 102. The reference line is perpendicular to the plugging direction of the edge connector 100, and divides each golden finger in the second row of golden fingers 102 into two parts.

It should be noted that, that "the reference line divides each golden finger in the second row of golden fingers 102 into two parts" means that a length of a part, on each side of the reference line, of each golden finger in the second row of golden fingers 102 is greater than 0 in the plugging direction of the edge connector 100.

In the foregoing technical solution, in a process of powering on the plurality of golden fingers in the second row of golden fingers 102, the grounded golden finger can be powered on before the golden finger for transmitting a power signal, and the golden finger for transmitting a power signal can be powered on before the golden finger for transmitting a communication signal, and in a power-off process, the golden finger for transmitting a communication signal can be powered off before the golden finger for transmitting a power signal, and the golden finger for transmitting a power signal can be powered off before the grounded golden finger. In the foregoing technical solution, the grounded golden finger is the first to be powered on and the last to be powered off, to ensure security of the second row of golden fingers 102, and avoid life span shortening of the edge connector 100 caused by a problem such as surge overshoot. The golden finger for transmitting a power signal is powered on before the golden finger for transmitting a communication signal, and is powered off after the golden finger for transmitting a communication signal, to ensure that the golden finger for transmitting a communication signal can integrally transmit a signal, and avoid a problem that a signal transmitted on the golden finger for transmitting a communication signal is lost because the golden finger fails to be powered on in time.

In still another implementation of this application, as shown in FIG. 2, a quantity of golden fingers included in the second row of golden fingers 102 is the same as a quantity of golden fingers included in the first row of golden fingers 101. In the plugging direction of the edge connector 100, each golden finger in the first row of golden fingers 101 is in a same column as a golden finger in the second row of golden fingers 102, and two golden fingers in a same column are configured to transmit signals of a same type. It should be noted that a column extension direction is shown in FIG. 2.

Referring to FIG. 1, in a process in which the edge connector 100 is plugged into the female connector 110, a contact spring plate in contact with a golden finger in the second row of golden fingers 102 is first in contact with another golden finger in a same column as the golden finger, and then slides over the other golden finger while keeping in contact with the other golden finger. It is ensured that two golden fingers in a same column can transmit signals of a same type, to avoid that signals transmitted on the golden fingers in the edge connector are disordered in the process in which the edge connector is plugged into the female connector.

Figure 4:
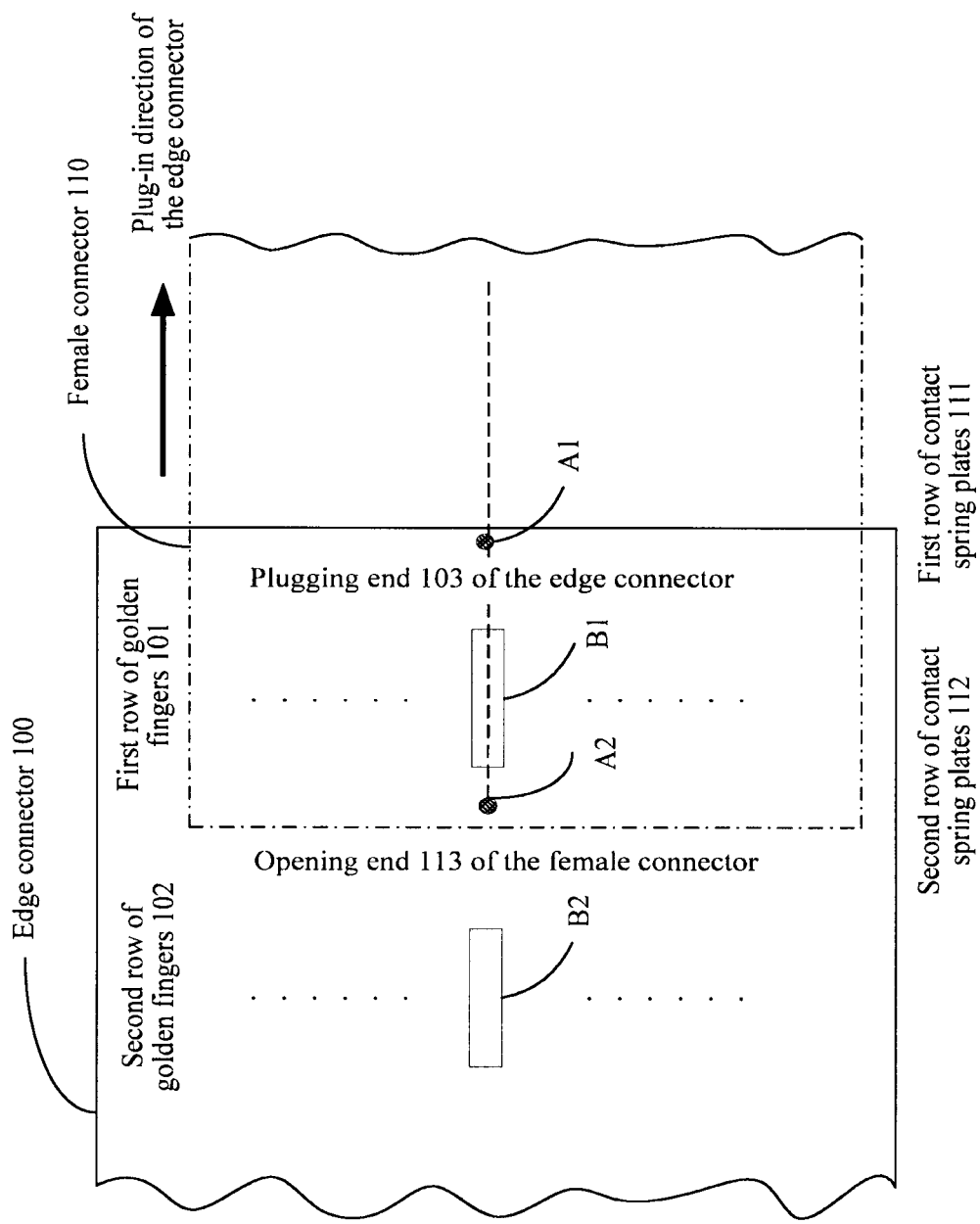
FIG. 4 is a schematic diagram of a process in which an edge connector is plugged into a female connector according to this application.

Referring to FIG. 4, a column of golden fingers and a corresponding column of contact spring plates are used as examples in FIG. 4 to describe a contact relationship between a contact spring plate and a golden finger in the process in which the edge connector 100 is plugged into the female connector 110. Further, in the process in which the edge connector 100 is plugged into the female connector 110, a second contact spring plate A2 in the female connector 110 is finally in contact with a golden finger B2 in the second row of golden fingers 102 of the edge connector 100, and a first contact spring plate A1 in the female connector 110 is finally in contact with a golden finger B1 in the first row of golden fingers 101 of the edge connector 100. However, with reference to FIG. 4, it is easy to see that before the second contact spring plate A2 is in contact with the golden finger B2, the second contact spring plate A2 is first in contact with the golden finger B1, slides over the golden finger B1 while keeping in contact with the golden finger B1, and is then in contact with the golden finger B2. The golden finger B1 is finally in contact with the contact spring plate A1. Therefore, if a type of a signal transmitted on the contact spring plate A2 is different from a type of a signal transmitted on the contact spring plate A1, when the contact spring plate A2 is in contact with the golden finger B1, signal transmission on the golden finger B1 is disordered because a type of a signal actually transmitted on the golden finger B1 is different from a type of a signal that ought to be transmitted on the golden finger B1.

With reference to the foregoing analysis, it may be learned that for the female connector, each first contact spring plate is in a same column as a second contact spring plate, and the first contact spring plate and the second contact spring plate in the same column also need to transmit signals of a same type.

This is because in the process in which the edge connector 100 is plugged into the female connector 110, before each second contact spring plate is in contact with a golden finger in the second row of golden fingers, the second contact spring plate is first in contact with a golden finger in the first row of golden fingers 101, and the second contact spring plate slides over the golden finger in the first row of golden fingers 101 while keeping in contact with the golden finger, and is then in contact with the golden finger in the second row of golden fingers 102. Therefore, if the second contact spring plate and the first contact spring plate in the same column transmit signals of different types, in the process in which the edge connector 100 is plugged into the female connector 110, signal transmission on the golden finger in the first row of golden fingers 101 is disordered because a type of an actually received signal is different from a type of a signal that ought to be received.

In still another specific implementation of this application, two golden fingers in a same column that are both for grounding are connected. Such design can reduce a technology difficulty in manufacturing the edge connector 100 while ensuring that the edge connector 100 works normally.

In still another specific implementation of this application, in the plurality of golden fingers in the first row of golden fingers 101 and the plurality of golden fingers in the second row of golden fingers 102, central lines, separately in the plugging direction of the edge connector 100, of two end parts that are of two golden fingers in a same column and that are adjacent to each other substantially overlap. Therefore, golden fingers in a same column each can be in good contact with a corresponding contact spring plate, to produce a relatively good signal transmission effect.

It should be noted that the essential overlapping means that the central lines, separately in the plugging direction of the edge connector 100, of the two end parts that are of the two golden fingers in the same column and that are adjacent to each other may not completely overlap, or in other words, a spacing between the two central lines may be greater than 0, or in other words, a spacing between the two central lines may fall within a specific range, and the specific range needs to be subject to understanding of a person skilled in the art. Details are not described herein.

In still another specific implementation of this application, second ends of all the golden fingers in the second row of golden fingers 102 are aligned with each other, and the second end of each golden finger in the second row of golden fingers 102 is the other end opposite to an end that is of the golden finger in the second row of golden fingers 102 and that is close to the plugging end 103. In this technical solution, because the second ends of all the golden fingers in the second row of golden fingers 102 are aligned with each other, the base of the edge connector 100 is divided into relatively regular areas by the second row of golden fingers 102, thereby facilitating arrangement of another component on the base.

It should be noted that the alignment means that the second ends of all the golden fingers in the second row of golden fingers 102 are substantially in a same straight line perpendicular to the plugging direction of the edge connector 100. It should be emphasized that, that the second ends of all the golden fingers in the second row of golden fingers 102 are substantially in the same straight line means that the second ends of all the golden fingers in the second row of golden fingers 102 may not be completely in a same straight line, or in other words, the second ends of all the golden fingers in the second row of golden fingers 102 may form a curve, but a bending degree of the curve is limited. Limitation on the bending degree of the curve needs to be subject to understanding of a person skilled in the art. Details are not described herein.

In still another specific implementation of this application, a minimum spacing between the first row of golden fingers 101 and the second row of golden fingers 102 meets a requirement of an electrical short circuit, and a maximum spacing is less than or equal to a length of a shortest golden finger in the edge connector 100 to help reduce a surface area, occupied by the first row of golden fingers and the second row of golden fingers, of the base of the edge connector, thereby further facilitating miniaturization of the edge connector.

It should be noted that there is assembly tolerance between the edge connector 100 and the female connector 110 in the process in which the edge connector 100 is plugged into the female connector 110. Therefore, during setting of the minimum spacing between the first row of golden fingers 101 and the second row of golden fingers 102, not only that the golden finger in the first row of golden fingers 101 is not in contact with the golden finger in the second row of golden fingers 102 needs to be considered, but also the assembly tolerance needs to be considered, to avoid an electrical short circuit caused by an excessively small spacing between the first row of golden fingers 101 and the second row of golden fingers 102 in the process in which the edge connector 100 is plugged into the female connector 110.

In another embodiment of the present disclosure, the edge connector 100 shown in FIG. 2 may include three or more than three rows of golden fingers, and the three or more than three rows of golden fingers are arranged in the plugging direction of the edge connector 100 in units of a row. The three or more than three rows of golden fingers include one row of far-end golden fingers and two or more than two rows of near-end golden fingers. The one row of far-end golden fingers is a row of golden fingers that is the farthest from the plugging end 103 of the edge connector among the three or more than three rows of golden fingers. The two or more than two rows of near-end golden fingers include one row of near-end golden fingers that is adjacent to the plugging end 103 of the edge connector, and further include one row of near-end golden fingers that is adjacent to the one row of far-end golden fingers.

It should be noted that when the edge connector 100 includes three or more than three rows of golden fingers, other rows of near-end golden fingers other than one row of far-end golden fingers that is the farthest from the plugging end 103 of the edge connector may be designed based on a structure of the first row of golden fingers 101.

It should be further noted that when the edge connector 100 includes three or more than three rows of golden fingers, for any golden finger in any row of golden fingers, in the plugging direction of the edge connector 100, each of other rows of golden fingers includes a golden finger that is in a same column as the golden finger. Types of signals transmitted on three or more than three golden fingers that are in a same column in the plugging direction of the edge connector 100 are the same. For example, the three or more than three golden fingers in the same column are all grounded golden fingers, or are all golden fingers for transmitting a power signal, or are all golden fingers for transmitting a communication signal.

Referring to FIG. 1 and FIG. 3, with reference to the edge connector 100 in the foregoing embodiment, in the connector component provided in this application, a spacing between the first row of contact spring plates 111 and the second row of contact spring plates 112 is $L_1$, a maximum distance between a second end of each golden finger in the first row of golden fingers 101 and a first end of a golden finger that is in the second row of golden fingers 102 and that is in a same column as the golden finger in the first row of golden fingers 101 is $S_1$, and a maximum distance between a first end of each golden finger in the first row of golden fingers 101 and a second end of a golden finger that is in the second row of golden fingers 102 and that is in a same column as the golden finger in the first row of golden fingers 101 is $S_2$, where $L_1$, $S_1$, and $S_2$ each are an integer greater than 0, and $L_1$ is greater than or equal to $S_1$ and less than or equal to $S_2$. The second end of each golden finger in the second row of golden fingers 102 is the other end opposite to an end that is of the golden finger in the second row of golden fingers 102 and that is close to the plugging end 103. This solution is to ensure that each contact spring plate in the first row of contact spring plates 111 and each contact spring plate in the second row of contact spring plates 112 each can be in contact with a corresponding golden finger.

Figure 5:
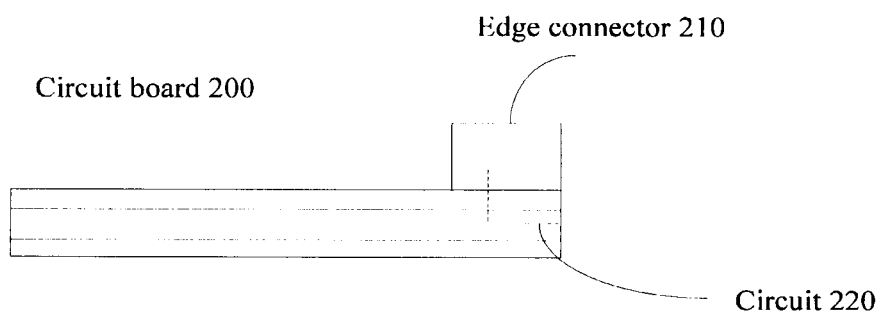
FIG. 5 is a schematic structural diagram of a circuit board according to this application.

Referring to FIG. 5, FIG. 5 is a schematic structural diagram of a circuit board 200 according to this application. It should be noted that the circuit board 200 in this application is not a bare board, but a component formed after another component such as a chip, a connector, or a filter has been integrated into a bare board, and the component is referred to as a circuit board in this application. It should be further noted that the circuit board 200 may be applied to an optical module, or may be applied to an electrical module. Further, the circuit board 200 includes an edge connector 210 and a circuit 220, and each golden finger in the edge connector 210 is connected to the circuit 220. It should be noted that the edge connector 210 used in this application may be any edge connector in the foregoing embodiment.

In an implementation of this application, the edge connector 210 may be disposed at an edge of the circuit board 200 and be integrated with the circuit board 200.

It should be noted that because a part that forms the circuit 220 may alternatively be a cable in addition to an element such as a capacitor, a resistor, or an inductor, during specific implementation, that each golden finger in the edge connector 210 may be connected to the circuit 220 means that the golden finger may be directly electrically connected to the cable or the element.

Compared with an edge connector in the other approaches, the edge connector 210 used in the circuit board 200 can avoid problems such as surge overshoot and current backflow caused when golden fingers in a same row are simultaneously powered on or simultaneously powered off. Therefore, the circuit board 200 in this application can have relatively good security performance due to relatively good security performance of the used edge connector 210.

In another implementation of this application, the circuit board 200 further includes a cable layer. The cable layer is at an inner layer of the circuit board 200, and the circuit 220 is disposed at the cable layer.

It should be noted that each golden finger for transmitting a communication signal in the edge connector 210 can be connected to the circuit 220 at the cable layer using a blind hole.

Because the cable layer is at the inner layer of the circuit board 200, and the circuit 220 is disposed at the cable layer, the circuit transmits a signal at a relatively fast rate, thereby helping increase a rate of transmitting a signal between the edge connector and the circuit in the circuit board.

Figure 6:
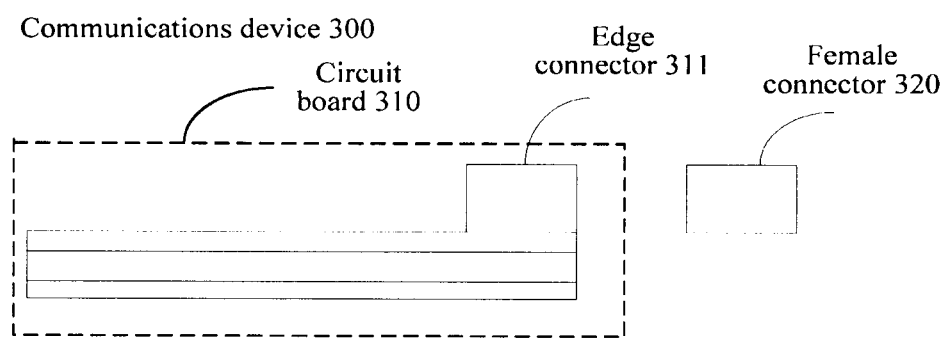
FIG. 6 is a schematic structural diagram of a communications device according to this application.

Referring to FIG. 6, FIG. 6 is a schematic structural diagram of a communications device 300 according to this application. The communications device 300 may be a communication cabinet or the like. Further, the communications device 300 includes a circuit board 310 and a female connector 320. An edge connector 311 on the circuit board 310 is plugged into the female connector 320 to connect to the female connector 320. For a specific structure of the circuit board 310, refer to related descriptions of the circuit board 200 in the foregoing embodiment. Compared with a circuit board in the other approaches, the circuit board 310 used in the communications device 300 has better security performance, and therefore the communications device 300 in this application can also have relatively good security performance.

The foregoing descriptions merely disclose example embodiments of the present disclosure and definitely cannot be used to limit the scope of the claims of the present disclosure, a person of ordinary skill in the art can understand that all or some procedures for implementing the embodiments, and equivalent changes made based on the claims of the present disclosure still fall within the scope of the present disclosure.

The invention claimed is:

1. A signal transmitting method, comprising:
   transmitting a power signal through a power signal transmitting golden finger of the edge connector, the edge connector comprising a grounded golden finger coupled to a ground;
   transmitting a communication signal through a communication signal transmitting golden finger of the edge connector;
   wherein the edge connector further comprises:
      a base board having one edge as a plugging end of the edge connector;
      a first row of golden fingers adjacent to the plugging end including a first plurality of golden fingers disposed in parallel and isolated from each other on the base board; and
      a second row of golden fingers including a second plurality of golden fingers disposed in parallel and isolated from each other on the base board farther away from the plugging end than the first row of golden fingers;
      wherein each golden finger in the first row of golden fingers has a first end proximate to the plugging end and a second end opposite to the first end, the first row of golden fingers includes the grounded golden finger, the power signal transmitting golden finger, and the communication signal transmitting golden finger, the grounded golden finger is longer than the power signal transmitting golden finger or the communication signal transmitting golden finger;
      the first end of the grounded golden finger in the first row of golden fingers extends farther toward the plugging end than the first end of the power signal transmitting golden finger, and the first end of the power signal transmitting golden finger extends farther toward the plugging end than the first end of the communication signal transmitting golden finger;
      the second end of the grounded golden finger extends farther away from the plugging end than the second end of the power signal transmitting golden finger, and the second end of the power signal transmitting golden finger extends farther away from the plugging end than the second end of the communication signal transmitting golden finger; and
      each golden finger in the second row of golden fingers has a third end proximate to the first row of golden fingers and a fourth end opposite to the third end, the second row of golden fingers includes a grounded golden finger and one or more non-grounded golden fingers, the grounded golden finger in the second row is longer than the non-grounded golden fingers, and the third end of the grounded golden finger in the second row of golden fingers extends farther toward the plugging end than the third end of the non-grounded golden fingers.

2. The signal transmitting method of claim 1, wherein a quantity of golden fingers in the second row of golden fingers is same as a quantity of golden fingers in the first row of golden fingers, each golden finger in the first row of golden fingers corresponds to a golden finger in the second row of golden fingers, and two corresponding golden fingers are configured to transmit signals of a same type.

3. The signal transmitting method of claim 2, wherein the grounded golden finger in the first row of golden fingers and the corresponding grounded golden finger in the second row of golden fingers are coupled.

4. The signal transmitting method of claim 2, wherein each golden finger in the first row of golden fingers and a corresponding golden finger in the second row of golden fingers are substantially aligned in a direction perpendicular to the plugging end.

5. The signal transmitting method of claim 1, wherein the second ends of all the golden fingers in the second row of golden fingers are aligned with each other.

6. The signal transmitting method of claim 2, wherein a minimum spacing between a golden finger in the first row of golden fingers and a corresponding golden finger in the second row of golden fingers is greater than a minimum distance required for preventing an electrical short circuit, and a maximum spacing between a golden finger in the first row of golden fingers and a corresponding golden finger in the second row of golden fingers is less than or equal to a length of a shortest golden finger in the edge connector.

7. The signal transmitting method of claim 1, wherein each golden finger is electrically coupled to a circuit.

8. A circuit board, comprising:
an edge connector at an edge of the circuit board, the edge being a plugging end of the edge connector and the edge connector comprising a first row and a second row of golden fingers; and
one or more circuits, each golden finger of the edge connector being coupled to a circuit of the one or more circuits;
wherein the first row of golden fingers is adjacent to the plugging end and includes a first plurality of golden fingers disposed in parallel and isolated from each other on the circuit board, and the second row of golden fingers includes a second plurality of golden fingers disposed in parallel and isolated from each other on the circuit board, the second plurality of golden fingers being located farther away from the plugging end than the first row of golden fingers;
each golden finger in the first row of golden fingers has a first end proximate to the plugging end and a second end opposite to the first end, the first row of golden fingers includes a grounded golden finger, a power signal transmitting golden finger, and a communication signal transmitting golden finger, the grounded golden finger is longer than the power signal transmitting golden finger or the communication signal transmitting golden finger, the first end of the grounded golden finger in the first row of golden fingers extends farther toward the plugging end than the first end of the power signal transmitting golden finger or the first end of the communication signal transmitting golden finger, the second end of the grounded golden finger extends farther away from the plugging end than the second end of the power signal transmitting golden finger, and the second end of the power signal transmitting golden finger extends farther away from the plugging end than the second end of the communication signal transmitting golden finger; and
each golden finger in the second row of golden fingers has a third end proximate to the first row of golden fingers and a fourth end opposite to the third end, the second row of golden fingers includes a grounded golden finger and one or more non-grounded golden fingers, the grounded golden finger in the second row is longer than the non-grounded golden fingers, and the third end of the grounded golden finger in the second row of golden fingers extends farther toward the plugging end than the third end of the non-grounded golden fingers.

9. The circuit board of claim 8, further comprising a cable layer at an inner layer of the circuit board, and the circuit being disposed at the cable layer.

10. A connector component system, comprising:
a female connector; and
an edge connector plugged into the female connector;
the female connector comprising:
a first row of contact spring plates including a first plurality of contact spring plates, each contact spring plate of the first plurality of contact spring plates being configured to be coupled to a corresponding golden finger of a first row of golden fingers of the edge connector; and
a second row of contact spring plates including a second plurality of contact spring plates, each contact spring plate of the second plurality of contact spring plates being configured to be coupled to a corresponding golden finger of a second row of golden fingers of the edge connector;
the edge connector comprising:
a base board having one edge as a plugging end of the edge connector;
the first row of golden fingers adjacent to the plugging end and including the first plurality of golden fingers disposed in parallel and isolated from each other on the base; and
the second row of golden fingers including the second plurality of golden fingers disposed in parallel and isolated from each other on the base board, the second plurality of golden fingers being located farther away from the plugging end than the first row of golden fingers;
wherein each golden finger in the first row of golden fingers has a first end proximate to the plugging end and a second end opposite to the first end, the first row of golden fingers includes a grounded golden finger, a power signal transmitting golden finger, and a communication signal transmitting golden finger, the grounded golden finger is longer than the power signal transmitting golden finger or the communication signal transmitting golden finger, the first end of the grounded golden finger in the first row of golden fingers extends farther toward the plugging end than the first end of the power signal transmitting golden finger or the first end of the communication signal transmitting golden finger, the second end of the grounded golden finger extends farther away from the plugging end than the second end of the power signal transmitting golden finger, and the second end of the power signal transmitting golden finger extends farther away from the plugging end than the second end of the communication signal transmitting golden finger; and
each golden finger in the second row of golden fingers has a third end proximate to the first row of golden fingers and a fourth end opposite to the third end, the second row of golden fingers includes a grounded golden finger and one or more non-grounded golden fingers, the grounded golden finger in the second row is longer than the non-grounded golden fingers, and the third end of the grounded golden finger in the second row of golden fingers extends farther toward the plugging end than the third end of the non-grounded golden fingers.

11. The connector component of claim 10, wherein a spacing between the first row of contact spring plates and the second row of contact spring plates is $L_1$, a maximum distance between a second end of each golden finger in the first row of golden fingers and a third end of a golden finger in the second row of golden fingers in a same column as the golden finger in the first row of golden fingers is $S_1$, and a maximum distance between a first end of each golden finger in the first row of golden fingers and a fourth end of a golden finger in the second row of golden fingers in a same column as the golden finger in the first row of golden fingers is $S_2$, the $L_1$, the $S_1$, and the $S_2$ each is a number greater than zero, the $L_1$ being greater than or equal to the $S_1$ and less than or equal to the $S_2$, and a fourth end of each golden finger in the second row of golden fingers is opposite to an end of said golden finger in the second row of golden fingers proximate to the plugging end.

12. The connector component of claim 10, wherein the first contact spring plates are in a straight line perpendicular to the plugging direction of the edge connector.

13. The connector component of claim 10, wherein the second contact spring plates are in a straight line perpendicular to the plugging direction of the edge connector.

14. A communications device, comprising:
   an edge connector, the edge connector comprising:
      a base board having one edge as a plugging end of the edge connector;
      a first row of golden fingers adjacent to the plugging end including a first plurality of golden fingers disposed in parallel and isolated from each other on the base board; and
      a second row of golden fingers including a second plurality of golden fingers disposed in parallel and isolated from each other on the base board, the second plurality of golden fingers being located farther away from the plugging end than the first row of golden fingers;
   wherein each golden finger in the first row of golden fingers has a first end proximate to the plugging end and a second end opposite to the first end, the first row of golden fingers includes a grounded golden finger, a power signal transmitting golden finger, and a communication signal transmitting golden finger, the grounded golden finger is longer than the power signal transmitting golden finger or the communication signal transmitting golden finger, the first end of the grounded golden finger in the first row of golden fingers extends farther toward the plugging end than the first end of the power signal transmitting golden finger or the first end of the communication signal transmitting golden finger, the second end of the grounded golden finger extends farther away from the plugging end than the second end of the power signal transmitting golden finger, and the second end of the power signal transmitting golden finger extends farther away from the plugging end than the second end of the communication signal transmitting golden finger; and
   each golden finger in the second row of golden fingers has a third end proximate to the first row of golden fingers and a fourth end opposite to the first end, the second row of golden fingers includes a grounded golden finger and one or more non-grounded golden fingers, the grounded golden finger in the second row is longer than the non-grounded golden fingers, and the third end of the grounded golden finger in the second row of golden fingers extends farther toward the plugging end than the third end of the non-grounded golden fingers.

* * * * *